MULTIVIBRATOR FLASHER CIRCUIT

Filed Aug. 1, 1966

INVENTOR
ADAM L. KELLER
BY
Smythe & Moore
ATTORNEYS

United States Patent Office 3,421,108
Patented Jan. 7, 1969

3,421,108
MULTIVIBRATOR FLASHER CIRCUIT
Adam L. Keller, Michigan City, Ind., assignor to Swiss Controls & Research, Inc., Michigan City, Ind., a corporation of Illinois
Filed Aug. 1, 1966, Ser. No. 569,505
U.S. Cl. 331—113 13 Claims
Int. Cl. H03k 3/28

ABSTRACT OF THE DISCLOSURE

A two-stage multivibrator flasher circuit for automotive or like use wherein a load or power switching transistor is reverse biased during the "off" period to prevent or minimize leakage current therethrough. The reverse biasing means also protects the multivibrator transistor converted to the switching transistor from excessive reverse biasing voltages. Circuit means including a voltage divider and a suitably polarized diode may protect the other multivibrator transistor from excessive reverse biasing voltages, and circuit means including a Zener diode may provide for eliminating voltage ripples from a D.C. source for the multivibrator.

This invention relates to multivibrator flasher circuits and more particularly to a transistorized flasher circuit adapted for automotive and like use.

Various types of transistorized flasher circuits are known in the art. For automotive or like use, however, the circuit must be capable of switching lamp loads of up to 12 or more amperes from a 12-volt or more D.C. source, and it must be capable of operating continuously at an ambient temperature of 130° F. with no degradation of operation. At the same time, the circuitry package must be of a size and cost comparable to present mechanical devices, and the dissipation of heat within the package must be limited, for example, in the order of 2 watts. To meet these requirements it is proposed to provide a multivibrator flasher circuit utilizing a germanium power or load switching transistor and epoxy encapsulated silicon transistors for the multivibrator. Germanium transistors have the disadvantage, however, that they require a reliable source of reverse base-to-emitter bias when the load (lamps, in the case of a flasher) is in the "off" condition in order to prevent high leakage through the transistor, and such a source is not available or provided in known multivibrator flasher circuits. Epoxy encapsulated silicon transistors, due to their low cost, high reliability and high operating temperature capabilities, are particularly advantageous for a circuit or system having the above requirements, but they also have an absolute maximum reverse base-to-emitter voltage rating of about 6 volts which is exceeded at certain points in the operating cycle of known multivibrators when operating from a 12-volt D.C. supply source, such as an automobile battery.

It is an object of the present invention, therefore, to provide a multivibrator circuit for flashers and the like which utilizes a germanium power switching transistor and in which leakage through the transistor in the "off" condition is substantially avoided or minimized.

A further object is to provide a multivibrator circuit for operating from a 12-volt or more D.C. source of power in which epoxy encapsulated silicon transistors are employed and excessive reverse voltage between the base and the emitter of the transistors is avoided.

A further object is to provide a multivibrator circuit of the above character which operates either a single load circuit or alternately operates a pair of load circuits.

A further object is to provide a new and improved multivibrator flasher circuit that is inexpensive, compact, capable of operating at relatively high ambient temperatures, and particularly adapted for automotive or similar use.

A still further object is to provide a multivibrator flasher circuit for automobiles and the like in which false or erratic triggering pulses or ripples from a generator, alternator or the like are avoided.

In one aspect of the invention, there is provided a free-running, two-stage, common-emitter, collector-coupled transistor multivibrator which provides a timing circuit for a transistor switch connected in the load circuit of a lamp or the like. The load or power switching transistor comprises a germanium transitor having high current capacity but high leakage current unless reverse biased from base to emitter, and the two transistors of the multivibrator timing circuit are epoxy encapsulated silicon transistor amplifiers having a limited reverse base-to-emitter breakdown voltage. To provide such reverse bias for the load transistor when the lamp is in the "off" condition, a diode is connected across the base and emitter of the multivibrator transistor connected to the load transisor and is so connected as to be forward biased when the base of the multivibrator transistor becomes positive with respect to the emitter. This diode when in the conducting condition also serves as a substantially constant voltage device which limits the reverse base-to-emitter voltage of the associated transistor to a safe value. Alternatively, a resistor could be substituted for the diode but is less effective. To protect the other transistor of the multivibrator from excessive reverse base-to-emitter voltage, a resistor and a shunt diode are connected in the circuit to the transistor base, and a second resistor forming a voltage divider is connected across the base and emitter of the transistor. This second diode is so connected as to be forward biased when the transistor base is negative, i.e., the emitter-base circuit is forward biased.

The above and other objects, features and advantages of the invention will be apparent from the following description and accompanying drawing which illustrate exemplary embodiments of the invention.

In the drawing:

FIG. 1 is a circuit diagram of a preferred embodiment of the invention;

FIG. 2 shows a substitute arrangement for a part of the circuit of FIG. 1;

FIG. 3 shows an adaptation of the circuit of FIG. 1 to a system for alternately flashing lamps or the like; and FIG. 4 is an alternative form of voltage regulator for FIG. 1.

Figures 1, 2, 3, 4:
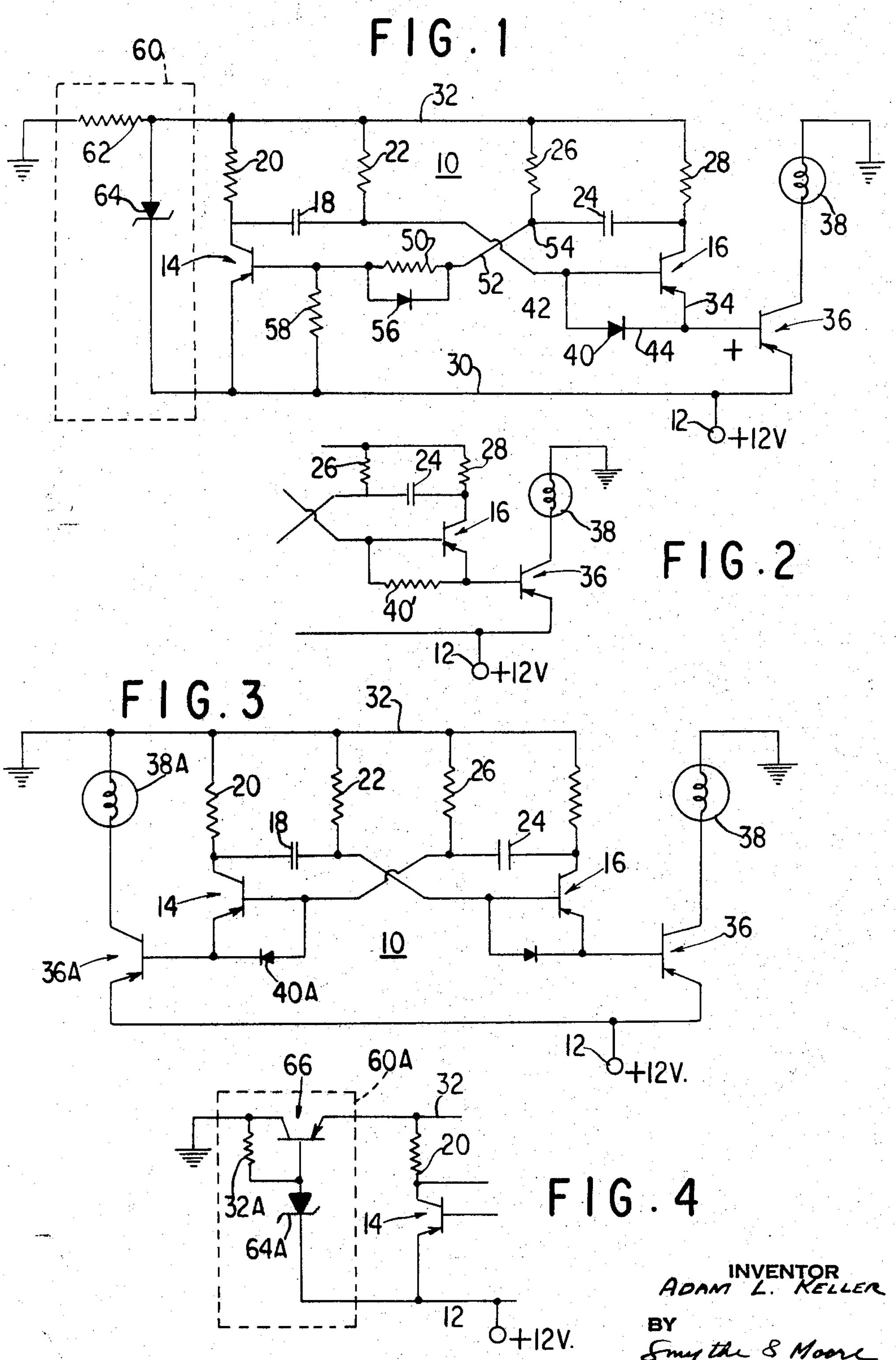

Referring to the drawing, and more particularly to FIG. 1, there is shown one form of a free-running multivibrator 10 fed from a 12-volt D.C. source 12, such as an automobile battery, and comprising a pair of common-emitter transistor amplifiers 14 and 16 having the collector of the first stage coupled to the base of the second stage through capacitor 18 and resistors 20 and 22, and the collector of the second stage coupled to the base of the first stage through capacitor 24 and resistors 26 and 28 in a well known manner. For convenience of illustration, the normally grounded emitters of the common-emitter transistor amplifiers 14 and 16 are shown as connected to a plus bus 30 while the collectors are connected to ground through the conductor 32. It will be evident, however, that the emitter bus could be grounded and the conductor 32 connected to the negative terminal of a D.C. power source.

To permit the use of relatively small capacitors in the multivibrator circuit, the emitter of transistor 16 is connected by conductor 34 to the base of a load switching transistor 36 having its emitter connected to the positive but 30 and its collector connected to ground through the lamp load 38. The emitter circuit of transistor 16 is thus cascaded through the emitter-base circuit of transistor 36, and the transistor 36 serves as a switch to turn the lamp load on and off periodically, that is, to flash in accordance with the timing or natural frequency of the free-running multivibrator oscillator 10, all as is known in the art.

In accordance with th present invention, however, the load transistor 36 comprises a germanium transistor, and the multivibrator transistors 14 and 16 comprise epoxy encapsulated silicon transistors which, as above described, have certain disadvantageous features when used in a 12-volt or higher D.C. system, i.e., the germanium transistor has a high leakage current (particularly at high temperatures) unless the base-to-emitter junction is reverse biased during the "off" period, and the epoxy transistors have a relatively low maximum reverse base-to-emitter voltage (in the order of 6 volts) which can be applied without breakdown of the transistor. To substantially avoid or at least minimize the reverse current leakage through the germanium transistor, the present invention provides a diode 40, which may comprise either a germanium or silicon, but preferably a germanium diode, which is connected across or in parallel with the emitter-base junction of the transistor 16 by connectors 42 and 44, and which is so connected as to be forward biased when the base of emitter 16 becomes positive during the "off" period of a lamp load as determined by the multivibrator 16, that is, the anode of diode 40 is connected by conductor 42 to the base of transistor 16 and the cathode of diode 40 is connected to the transistor emitter by conductor 44. Thus, during the "off" or non-conducting period of transistors 16 and 36 when the voltage applied to the base of transistor 16 becomes positive, a current flows through the diode 40 and applies a positive voltage to the base of transistor 36, thereby applying a reverse bias voltage $V_{eb}$ to the base-emitter junction. As above described, this reverse bias $V_{eb}$ prevents or substantially minimizes leakage current $I_{co}$ through the emitter-collector load circuit during at least a substantial portion of lamp "off" period.

The inherent characteristics or properties of either a germanium or silicon diode are such that when it conducts in the forward biased direction, the voltage drop across the diode falls to a low value, in the neighborhood of .4 volt for germanium and .7 volt for silicon, and this voltage drop remains substantially constant irrespective of the current. The diode 40 thus serves the additional function of limiting the reverse base-emitter voltage of the transistor 16 to a low safe value since the diode is connected across the base-emitter junction of the transistor as above described.

As shown in FIG. 2, a resistor 40' may be substituted for the diode 40 of the circuit of FIG. 1 and will accomplish a similar result insofar as providing a reverse base-to-emitter voltage for the transistor 36 and limiting the reverse base-emitter voltage of transistor 16 to a safe value. The other parts of the circuit are the same as in FIG. 1, as indicated by the reference numerals. While the use of a resistor instead of the diode is cheaper, the diode is more effective and is preferred since the resistance of the base to emitter junction decreases as the temperature increases and the ratio of the voltage drops across the resistor 40' and the transistor junction is thus not constant. It has been found, however, that a resistor of the proper value will work.

A shunt diode such as 40 cannot be used, however, to protect the transistor 14 of FIG. 1 from excessive reverse base-emitter voltage since it would provide a shorting circuit directly to the bus 30 during the "off" or non-conducting period of the transistor and thus cause complete malfunctioning of the multivibrator timing and oscillating circuit. To protect the transistor 14, therefore, the invention provides a series resistor 50 in the line 52 leading from the junction 54 of capacitor 24 and resistor 26 to the base of transistor 14, and a diode 56 for shunting the resistor 50 when forward biased. A second resistor 58 is also connected across or in parallel with the emitter-base circuit of transistor 14 at a point between the base and resistor 50. The diode 56 is so connected across resistor 50 as to be forward biased when transistor 14 is conducting, i.e., when the emitter to base is forward biased. Thus, when the transistor 14 is in the conducting condition, the diode 56 shorts out the resistor 50, and at the same time the emitter-to-base circuit shorts out the resistor 58. Therefore, resistors 50 and 58 have practically no effect on the circuit in the forward biased condition. When the point or junction 54 becomes positive, however, and a reverse bias is applied to the base of transistor 14, the diode 56 is non-conductive and the resistors 50 and 58 form a voltage divider whereby only a part of the voltage at point 54 is applied to the base of the transistor. Thus, the resistors 50 and 58 can be so proportioned that a maximum positive voltage of +4 volts, for example, is applied to the transistor base, and as long as the sum of the resistances is very high compared with that of the resistor 26, they do not adversely affect the multivibrator circuit. It has been found that the protection against reverse base-to-emitter overvoltage will be adequate if the following relationships are met:

(A) $R_1+R_2$ equal to or greater than 10 times $R_3$ (B) $$\left(\frac{R_1}{R_1+R_2}\right)(V_{ce})$$

equal to or less than $V_{ebo}$ (max) of transistor 14, where $R_1$ is the resistance of resistor 58
$R_2$ is the resistance of resistor 50
$R_3$ is the resistance of resistor 26

The two protective devices above described thus allow the use of low-cost, high reliability epoxy silicon semiconductor devices in conjunction with high efficiency, long life, germanium power switching devices, and a compact and inexpensive flasher circuit or system capable of operation at relatively high ambient temperatures and particularly adapted for automotive and similar uses is provided. The operation of the system will be evident from the above description. When the circuit is connected to the D.C. source 12 thorugh a suitable switch or the like, the free-running multivibrator 10 causes the germanium power transistor periodically to switch the lamp 38 load current "on" and "off" with the "on" and "off" time dependent upon the RC time constants of the multivibrator circuits. Diode 40 provides a reverse bias on the base of the germanium power transistor and thus avoids or prevents high leakage current during the "off" condition of the transistor, and at the same time protects the epoxy silicon transistor 16 from excessive reverse bias overvoltage. Voltage dividers 50 to 58 and diode 56 similarly protect the epoxy silicon transistor 14.

In FIG. 3 there is shown an adaptation of the flasher circuit by FIG. 1 to a system for operating alternate flashers or the like. Referring to this figure, a second load illustrated as a lamp 38A is connected in the emitter-collector circuit of a second germanium power switching transistor 36A. The base of the transistor 36A is connected to the emitter of the multivibrator transistor 14 in the same manner as the transistor 36 is connected to transistor 16 of FIGS. 1 and 3, and the connection in FIG. 1 between the emitter of transistor 14 and bus 30 is omitted as in the case of transistor 16. A diode 40A similar to the diode 40 is also connected across the base-emitter junction of transistor 14 and is connected for forward biasing in the same manner as diode 40. The operating circuit for lamp 38A on the left side of FIG. 3 is thus a duplicate of the operating circuit for lamp 38 on the righ side of FIGS. 1 and 3, and since transistor 14 conducts when 16 is off and vice versa, the lamps will alternately flash. The diode 40A serves as a protective device for both the germanium transistor 36A and the epoxy transistor 14 in the same manner as diode 40.

As above set forth, the flasher circuits of FIGS. 1 and 3 are particularly adapted for automotive and like use. In such usage, however, the generator for maintaining the battery charged frequently causes a ripple in the voltage and current supplied by the battery. When such battery serves as the D.C. source 12 for the multivibrator 10, the ripple could cause a false triggering or other erratic or malfunctioning behavior of the multivibrator. To eliminate any such disturbances, the invention also provides a voltage regulating or filtering circuit for the multivibrator circuit. One such circuit is shown on the left side of FIG. 1 and is enclosed in a dashed box 60 for illustrative purposes only. As shown in FIG. 1, the regulator 60 comprises a series resistor 62 connected between the bus 32 and ground, and a shunt Zener diode 64 connected across the buses 30 and 32 in parallel with the emitter-collector circuit of multivibrator transistor 14. At high values of supply voltage, 24 volts for example, the resistor 62 dissipates considerable amounts of power and generates considerable heat.

A more efficient and improved regulator 60A is shown in FIG. 4 wherein the emitter-base circuit of an amplifier transistor 66 serves as a series pass element connecting the bus 32 to ground, and a Zener diode 64A connected to the base of transistor 66 and bus 30 provides the reference voltage. Resistor 62A connected across the base-emitter junction of transistor 66 now furnishes only the base current for transistor 66 and sufficient current to keep diode 64A in regulation and thus dissipates low power.

While certain exemplary embodiments of the invention have been shown and described, it will be evident that changes and modifications may be made without departing from the spirit of the invention, and it is intended to be limited only by the scope of the appended claims.

What is claimed is:

1. In a multivibrator switching circuit for flashes or the like and adapted for automotive or like use, the combination of a source of D.C. power, a multivibrator circuit including a pair of transistors connected to said power source, a power switching transistor, a load circuit connected to said power source through the emitter and collector of said power switching transistor, a connection between the emitter of one of said pair of multivibrator transistors and the base of said power switching transistor, and means connected across the base and emitter of said one multivibrator transistor for applying a reverse bias voltage between the base and emitter of said power switching transistor when the base-emitter junction of said one transistor becomes reverse biased.

2. A combination as set forth in claim 1 in which said power switching transistor comprises a germanium transistor having high leakage current during nonconduction unless its base-emitter junction is reverse biased.

3. A combination as set forth in claim 1 in which said power switching transistor comprises a germanium transistor and said last named means connected across the base and emitter of said one multivibrator transistor comprises a diode connected to be forward biased when the base of said one transistor becomes positive relative to the emitter so as to be reverse biased.

4. A combination as set forth in claim 1 in which said power switching transistor comprises a germanium transistor and said last named means connected across the base and emitter of said one transistor comprises a resistor.

5. A combination as set forth in claim 1 in which said pair of multivibrator transistors comprises a pair of epoxy encapsulated silicon transistors, and said power switching transistor comprises a germanium transistor, and said last named means for applying a reverse bias voltage to the power switching transistor also limits the maximum reverse base to emitter voltage of said one multivibrator transistor to a safe value not exceeding the maximum rated reverse bias voltage of the epoxy silicon transistors, thereby to protect said one transistor from excessive reverse voltage breakdown.

6. A combination as set forth in claim 5 in which said last named means for applying a reverse bias voltage to the power switching transistor and limiting the maximum reverse base to emitter voltage of said one of the pair of epoxy silicon multivibrator transistors comprises a diode connected to be forward biased when a reverse base to emitter voltage is applied to said one multivibrator transistor.

7. A combination as set forth in claim 6 in which a voltage divider means including a resistor connected in series with the base circuit of the other of said pair of epoxy silicon multivibrator transistors and a resistor connected in parallel with the base-emitter junction of said other transistor limits the maximum reverse base to emitter voltage of said other transistor to protect said other transistor from excessive reverse voltage breakdown.

8. A combination as set forth in claim 7 in which said voltage divider means includes a diode connected in shunt with the series resistor and polarized to be conductive during non-conductive periods of said other transistor.

9. A combination as set forth in claim 1 in which said pair of multivibrator transistors comprises a pair of epoxy encapsulated silicon transistors, and a voltage divider means comprising a resistor connected in series with the base of the other of said pair of epoxy silicon transistors, a resistor connected in parallel with the base-emitter junction of said other transistor, and a diode connected in shunt with said series resistor provides for limiting the maximum reverse base to emitter voltage applied to said other transistor.

10. A combination as set forth in claim 1 in which said power switching transistor comprises a germanium transistor, a second power switching germanium transistor operates a second load circuit, the base of said second power switching transistor is connected to the emitter of the other of said multivibrator transistors whereby the first and second load circuits are alternately opened and closed, and a diode is connected in shunt with the base-emitter junction of each of said multivibrator transistors to provide a reverse bias voltage between the base and emitter of the associated power switching transistor when the base-emitter junction of the multivibrator transistor becomes reverse biased.

11. A combination as set forth in claim 10 in which said pair of multivibrator transistors comprises a pair of epoxy encapsulated silicon transistors.

12. A combination as set forth in claim 1 in which a voltage regulating means including a Zener diode provides for substantially eliminating voltage ripples from a D.C. supply source for said multivibrator circuit.

13. In a multivibrator switching circuit utilizing at least one epoxy encapsulated silicon transistor and adapted for use with a 12-volt or more D.C. power source, means for protecting said epoxy silicon transistor from excessive reverse base to emitter voltage comprising a resistor connected in said multivibrator circuit in series with the base of said transistor, a resistor connected in parallel with the base-emitter junction of said transistor, said resistors forming a voltage divider, and a diode connected in shunt with said series resistor and polarized to be conductive during non-conductive periods of said transistor.

References Cited

UNITED STATES PATENTS 2,994,013 7/1961 Skellett ---------- 331—113 X

JOHN KOMINSKI, *Primary Examiner.*

SIEGFRIED H. GRIMM, *Assistant Examiner.*

U.S. Cl. X.R.

331—62, 75, 109